United States Patent
Satoh

(10) Patent No.: US 7,423,330 B2
(45) Date of Patent: Sep. 9, 2008

(54) SEMICONDUCTOR DEVICE WITH STRAIN

(75) Inventor: Shigeo Satoh, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 268 days.

(21) Appl. No.: 10/970,160

(22) Filed: Oct. 22, 2004

(65) Prior Publication Data

US 2005/0285137 A1 Dec. 29, 2005

(30) Foreign Application Priority Data

Jun. 29, 2004 (JP) ............................. 2004-191405

(51) Int. Cl.
*H01L 23/58* (2006.01)
(52) U.S. Cl. ..................... 257/649; 257/213; 257/288; 257/368; 257/369; 257/506; 257/629; 257/632; 257/E27.06; 257/E27.062; 257/E29.02
(58) Field of Classification Search ............... None
See application file for complete search history.

(56) References Cited

U.S. PATENT DOCUMENTS

| | | | | |
|---|---|---|---|---|
| 6,943,391 | B2* | 9/2005 | Chi et al. .................. | 257/254 |
| 6,974,981 | B2* | 12/2005 | Chidambarrao et al. ...... | 257/265 |
| 6,982,465 | B2* | 1/2006 | Kumagai et al. ............. | 257/369 |
| 2004/0029323 | A1* | 2/2004 | Shimizu et al. ............. | 438/142 |
| 2004/0075148 | A1* | 4/2004 | Kumagai et al. ............. | 257/369 |
| 2004/0251479 | A1* | 12/2004 | Tsutsui et al. .............. | 257/249 |
| 2005/0230756 | A1* | 10/2005 | Chang et al. ................ | 257/351 |

FOREIGN PATENT DOCUMENTS

| | | |
|---|---|---|
| JP | 2003-86708 | 3/2003 |
| JP | 2003-273240 | 9/2003 |

OTHER PUBLICATIONS

Shinya Ito et al., IEDM 2000 Tech. Dig., "Mechanical Stress Effect of Etch-Stop Nitride and its Impact on Deep Submicron Transistor Design", pp. 247-250, 2000.
F. Ootsuka et al., IEDM 2000 Tech. Dig., "A Highly Dense, High-Performance 130nm node CMOS Technology for Large Scale System-on-a-Chip Applications", pp. 575-578, 2000.

(Continued)

*Primary Examiner*—Andy Huynh
*Assistant Examiner*—Hoang-Quan Ho
(74) *Attorney, Agent, or Firm*—Westerman, Hattori, Daniels & Adrian, LLP

(57) ABSTRACT

A semiconductor device includes: a semiconductor substrate having a p-MOS region; an element isolation region formed in a surface portion of the semiconductor substrate and defining p-MOS active regions in the p-MOS region; a p-MOS gate electrode structure formed above the semiconductor substrate, traversing the p-MOS active region and defining a p-MOS channel region under the p-MOS gate electrode structure; a compressive stress film selectively formed above the p-MOS active region and covering the p-MOS gate electrode structure; and a stress released region selectively formed above the element isolation region in the p-MOS region and releasing stress in the compressive stress film, wherein a compressive stress along the gate length direction and a tensile stress along the gate width direction are exerted on the p-MOS channel region. The performance of the semiconductor device can be improved by controlling the stress separately for the active region and element isolation region.

7 Claims, 18 Drawing Sheets

OTHER PUBLICATIONS

A. Shimizu et al., IEDM 2001 Tech. Dig., "Local Mechanical-Stress Control (LMC): A New Technique for CMOS-Performance Enhancement", pp. 433-436, 2001.

Yukihiro Kumagai et al., SSDM 2002, "Evaluation of change in drain current due to strain in 0.13-μm-node MOSFETs", pp. 14-15, 2002.

* cited by examiner

FIG.1A
PRIOR ART
|  | STRAIN | | |
|---|---|---|---|
|  | GATE LENGTH DIRECTION | DEPTH DIRECTION | GATE WIDTH DIRECTION |
| n-MOS | TENSILE | COM-PRESSIVE | TENSILE |
| p-MOS | COM-PRESSIVE | TENSILE | TENSILE |
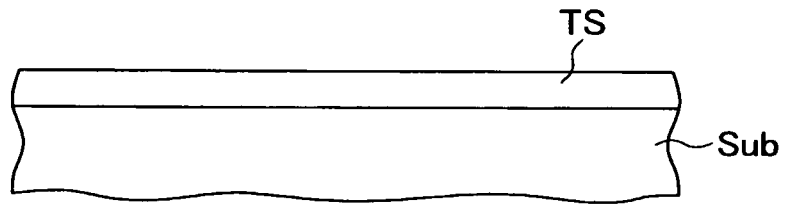
FIG.1B
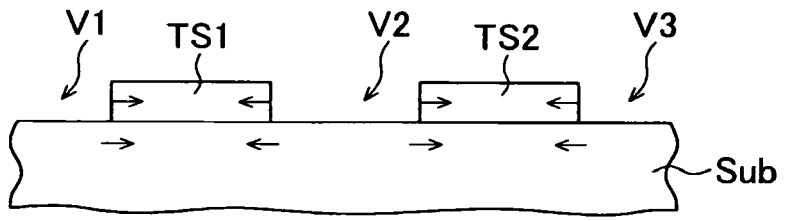
FIG.1C
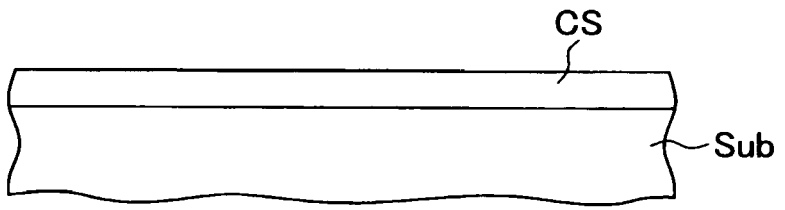
FIG.1D
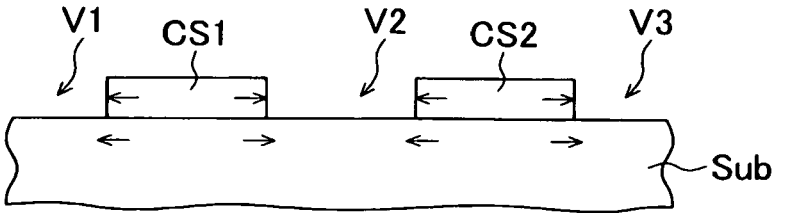
FIG.1E

FIG.4A

| FILM INTRINSIC STRESS | STRESS RELEASED REGION | STRAIN | | |
|---|---|---|---|---|
| | | GATE LENGTH DIRECTION | DEPTH DIRECTION | GATE WIDTH DIRECTION |
| TENSILE | NONE | TENSILE | COM-PRESSIVE | NONE |
| | STI REGION | TENSILE | COM-PRESSIVE | COM-PRESSIVE |
| | ACTIVE REGION | NONE | NONE | TENSILE |
| | WHOLE REGION | NONE | NONE | NONE |
| COM-PRESSIVE | NONE | COM-PRESSIVE | TENSILE | NONE |
| | STI REGION | COM-PRESSIVE | TENSILE | TENSILE |
| | ACTIVE REGION | NONE | NONE | COM-PRESSIVE |
| | WHOLE REGION | NONE | NONE | NONE |

FIG.4B

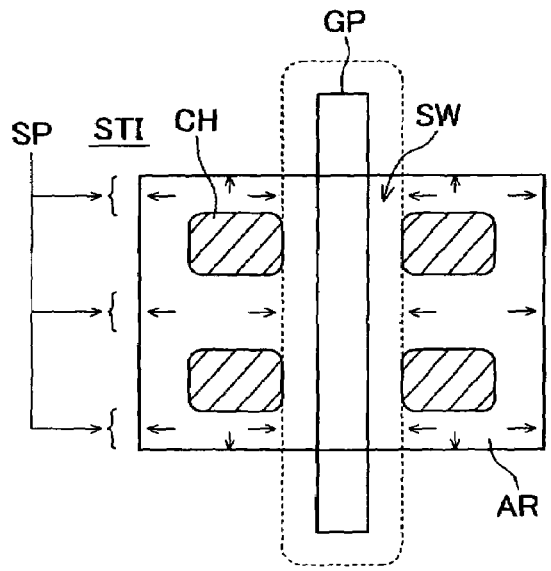

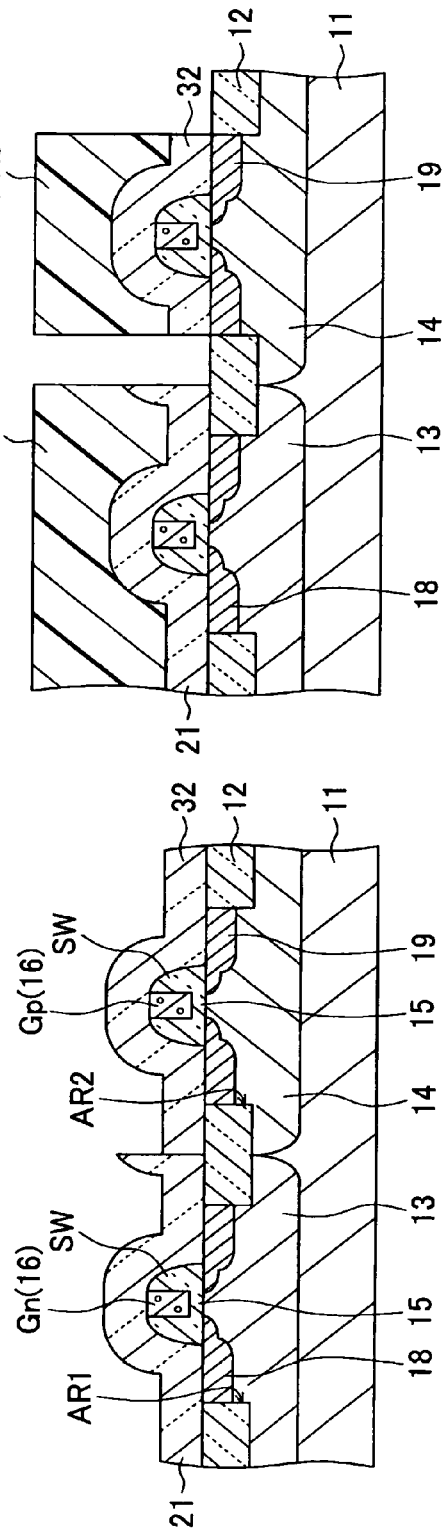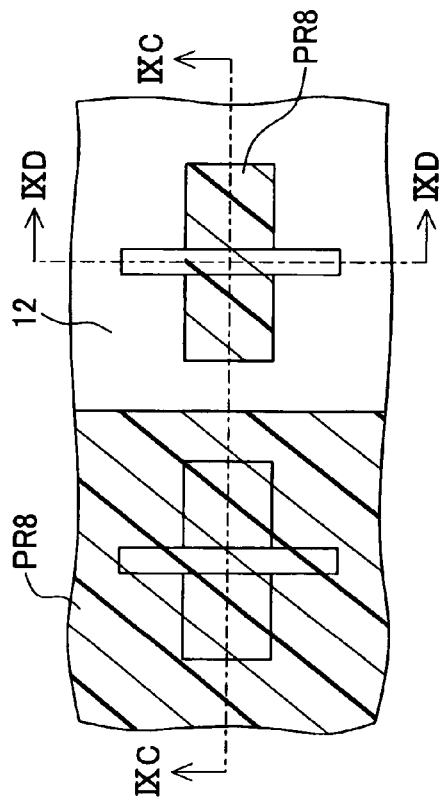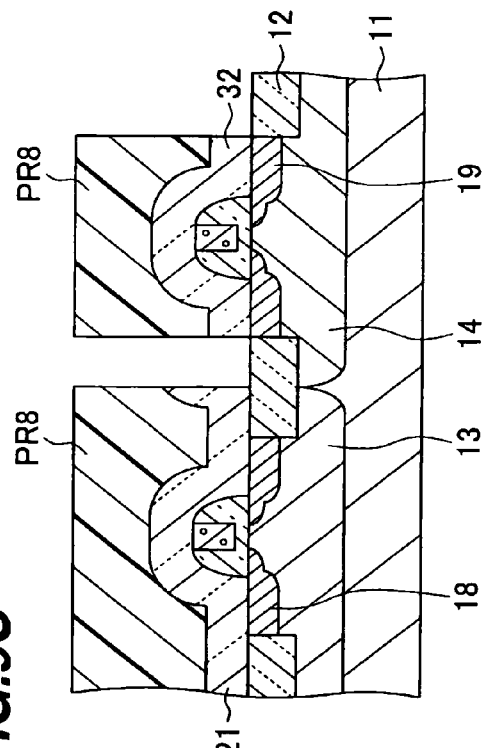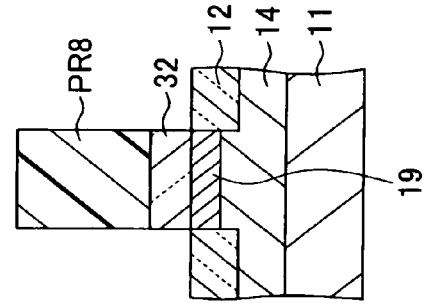

| EMBODI-MENTS | n-MOS | | p-MOS | |
|---|---|---|---|---|
| | FILM STRESS | RELEASED REGION | FILM STRESS | RELEASED REGION |
| E1 | TENSILE | NONE | TENSILE | ACTIVE REGION |
| E2 | TENSILE | NONE | COM-PRESSIVE | STI REGION |
| E3 | TENSILE | NONE | COM-PRESSIVE | STI REGION |
| E4 | COM-PRESSIVE | WHOLE REGION | COM-PRESSIVE | STI REGION |
| E5 | TENSILE | NONE | COM-PRESSIVE TENSILE | STI REGION ACTIVE REGION |

SEMICONDUCTOR DEVICE WITH STRAIN

CROSS REFERENCE TO RELATED APPLICATION

This application is based on and claims priority of Japanese Patent Application No. 2004-191405 filed on Jun. 29, 2004, the entire contents of which are incorporated herein by reference.

BACKGROUND OF THE INVENTION

A) Field of the Invention

The present invention relates to a semiconductor device, and more particularly to a semiconductor device having a contact etch stopper film having stress therein and formed above a semiconductor substrate.

B) Description of the Related Art

There are high demands for high integration and high speed of semiconductor integrated circuit devices. High integration and high speed have been achieved conventionally by reducing the size of a MOS field effect transistor (FET) which is a main constituent element of a semiconductor integrated circuit device. Miniaturization can obviously improve the integration degree and a shortened gate length can increase an operation speed. Miniaturization has been supported by lithography technologies of transferring a design pattern to a resist film. The requested minimum patterning size has become recently a size smaller than the wavelength of light used by lithography, and further miniaturization of MOS-FETs is becoming difficult.

A field effect transistor using a silicon oxide film on a semiconductor substrate as the gate insulating film (even by using not metal but semiconductor silicon as the gate electrode) has been called a MOSFET. As FETs are made fine, some structures have been adopted such as the structure that a silicon oxynitride film is used as the gate insulating film and the structure that a high dielectric constant insulating film of $HfO_2$ or the like stacked on a silicon oxide film is used as the gate insulating film. In this specification, FET having a gate insulating film made of insulators other than silicon oxide is also called MOSFET.

Namely, MOSFET is intended to mean a semiconductor field effect transistor having an insulated gate electrode.

Most of semiconductor integrated circuit devices aiming at low power consumption use a complementary (C) MOSFET (abbreviated to CMOS) constituted of an n-channel MOS-FET (n-MOSFET) and a p-channel MOSFET (p-MOSFET). In order to realize high speed of a CMOS integrated circuit, it is desired to improve the performance of both n-MOSFET and p-MOSFET.

A non-patent document No. 1 "IEDM 2000 Tech. Dig., p. 247" by Ito et al reports that as a compressive stress in a contact etch stopper film is made large, which film is a silicon nitride film formed by plasma-enhanced (PE) chemical vapor deposition (CVD) and a compressive stress film, a compressive stress is exerted along a gate length direction so that an on-current of p-MOS increases and an on-current of n-MOS decreases.

A non-patent document No. 2 "IEDM 2000 Tech. Dig., p. 575" by Ootsuka et al reports that as a tensile stress in a contact etch stopper film is made large, which film is a silicon nitride film formed by thermal CVD and a tensile stress film, a tensile stress is exerted along a gate length direction so that an on-current of n-MOS increases and an on-current of p-MOS decreases.

The compressive stress film is a film formed on an underlying silicon substrate in a compressed state. The compressive stress film has a compressive stress therein. The tensile stress film is a film formed on an underlying substrate in a stretched state. The tensile stress film has a tensile stress therein.

As described above, as the inner stress of a contact etch stopper film is increased, the on-current increases in one of an n-MOSFET and a p-MOSFET and decreases in the other so that the increase and decrease are canceled out and there is the tendency that the performance of the whole CMOS cannot be improved.

A non-patent document No. 3 "IEDM 2001 Tech. Dig., p. 433" by Shimizu et al reports that a silicon nitride film having a strong stress therein is used as a contact etch stopper film and Ge ions are implanted into a MOSFET region of a conductivity type of reducing an on-current to release the stress. If the contact etch stopper film is made of a silicon nitride film having a strong compressive stress formed by PE-CVD, Ge ions are implanted in the n-MOS region. If the contact etch stopper film is made of a silicon nitride film having a strong tensile stress formed by thermal CVD, Ge ions are implanted in the p-MOS region. It is possible to suppress a reduction in the on-current of MOSFET whose performance is otherwise degraded and to improve the performance of the whole CMOS.

A non-patent document No. 4 "SSDM 2002, p. 14" by Kumagai et al and a patent document No. 1, Japanese Patent Publication No. 2003-86708, disclose that if the gate length direction is disposed along the <110> direction on an Si (001) plane, the on-current of n-MOS increases by the tensile stress along the gate length direction and decreases by the tensile stress along a gate width direction, whereas the on-current of p-MOS decreases by the tensile stress along the gate length direction (increases by the compressive stress along the gate length direction) and decreases by the tensile stress along the gate width direction.

The patent document No. 1, Japanese Patent Publication No. 2003-86708, further discloses that a contact etch stopper film is made of a tensile stress film and disposed in an n-MOS region, and a contact etch stopper film is made of a compressive stress film and disposed in a p-MOS region, to improve the performance of the whole CMOS and to adjust the stress by the area of each contact etch stopper film.

A patent document No. 2, Japanese Patent Publication No. 2003-273240, discloses that in the state that the semiconductor surface between a gate insulating film and an element isolation region is covered with an insulating film functioning as a contact etch stopper film, a tensile stress film is formed in an n-MOS region and a compressive stress film is formed in a p-MOS region.

SUMMARY OF THE INVENTION

An object of this invention is to provide a semiconductor device whose performance is improved by utilizing stress.

Another object of this invention is to provide a semiconductor device whose performance is improved by controlling stress along a gate length direction and a gate width direction.

Still another object of this invention is to provide a semiconductor device whose performance is improved by controlling stress separately for an active region and an element isolation region.

According to one aspect of the present invention, there is provided a semiconductor device comprising: a semiconductor substrate having a p-channel MOSFET (p-MOS) region; an element isolation region formed in a surface portion of the semiconductor substrate, the element isolation region defining p-MOS active regions in the p-MOS region; a p-MOS gate electrode structure formed above the semiconductor substrate, traversing an intermediate portion of the p-MOS active region and defining a p-MOS channel region under the p-MOS gate electrode structure; a first contact etch stopper film having a compressive stress selectively formed above the p-MOS active region and covering the p-MOS gate electrode structure; and a stress released region selectively formed above the element isolation region in the p-MOS region and releasing stress in the first contact etch stopper film, wherein the first contact etch stopper film on the p-MOS active region exerts a compressive stress on the p-MOS channel region along a gate length direction, and the first contact etch stopper film and the stress released region exert a tensile stress on the p-MOS channel region along a gate width direction.

According to another aspect of the present invention, there is provided a semiconductor device comprising: a semiconductor substrate having a p-channel MOSFET (p-MOS) region; an element isolation region formed in a surface portion of the semiconductor substrate, the element isolation region defining p-MOS active regions in the p-MOS region; a p-MOS gate electrode structure formed above the semiconductor substrate, traversing an intermediate portion of the p-MOS active region and defining a p-MOS channel region under the p-MOS gate electrode structure; a second contact etch stopper film having a tensile stress, selectively formed above the element isolation region in the p-MOS region, and a third contact etch stopper film selectively formed in the p-MOS active region and covering the p-MOS gate electrode structure, the third contact etch stopper film being made of the same film as the second contact etch stopper film and stress in the third contact etch stopper film being released, wherein the second contact etch stopper film on the element isolation region in the p-MOS region exerts the tensile stress on the p-MOS channel region along the gate width direction.

The performance of MOSFET can be improved by stress along the gate length direction and gate width direction exerted on the channel region.

BRIEF DESCRIPTION OF THE DRAWINGS

FIG. 1A is a table summarizing the type of stress capable of increasing an on-current of a CMOS circuit and FIG. 1B to 1E are schematic cross sectional views showing stresses generated when a film having stress therein is patterned.

FIG. 4A is a table showing the type of stress capable of being generated when a compressive stress film and a tensile stress film are selectively formed by dividing a MOS region into an active region and an STI region, and FIG. 4B is a plan view showing a layout example of contact plugs.

FIGS. 9A to 9D are cross sectional views and a plan view of a semiconductor device according to a third embodiment.

DESCRIPTION OF THE PREFERRED EMBODIMENTS

Figure 2A:
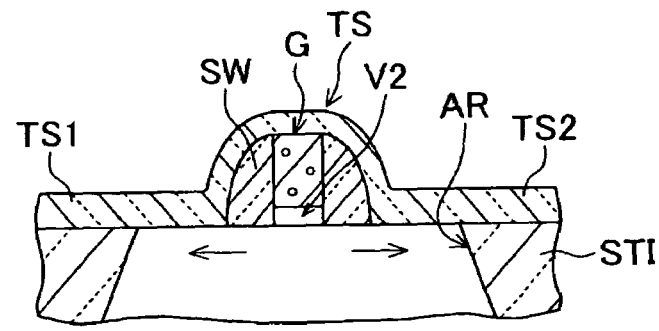
FIGS. 2A to 2H are cross sectional views and plan views showing stresses capable of being generated when a tensile stress film is formed on a MOSFET.

The present inventor calculated a stress distribution by depositing a contact etch stopper film having tensile stress on a silicon substrate and partially etching it. It has been found that stress exerted on the silicon substrate is negligible if a stress film is deposited on a flat surface, and that stress is exerted on the silicon substrate if the stress film is partially removed or bent upward or the like.

It has been found that a lateral compressive stress perpendicular to the border of the contact etch stopper film is generated near the surface of the silicon substrate in the region where the contact etch stopper film having the tensile stress is removed, and that a lateral tensile stress perpendicular to the border of the contact etch stopper film is generated near the surface of the silicon substrate in the region where the contact etch stopper film having the tensile stress is removed.

FIG. 1A is the table summarizing the type (tensile stress, compressive stress) of stress which increases the on-current of an n-MOSFET and a p-MOSFET of CMOS, relative to a gate length direction, a depth direction and a gate width direction. Stress along the depth direction is complementary with stress along the gate length direction. As disclosed in the non-patent document No. 4 and patent document No. 1, the tensile stress both along the gate length direction and gate width direction increases the on-current of n-MOSFET, whereas the on-current of p-MOSFET is increased by the compressive stress along the gate length direction and decreased by the tensile stress along the gate width direction.

FIGS. 1B to 1E are schematic cross sectional views illustrating the studies made by the present inventor. As shown in FIG. 1B, a tensile stress film TS is formed on a flat surface of a silicon substrate Sub. For example, the tensile stress film is a film formed by thermal CVD. Stress is not generated in the silicon substrate Sub.

As shown in FIG. 1C, the tensile stress film TS shown in FIG. 1B is partially and selectively removed to leave tensile stress film patterns TS1 and TS2 defined by stress released portions V1, V2 and V3. The stress released portion is a region where the stress is released, and is formed by removing the film or by releasing stress in the film by leaving the film. For example, Ge ions are implanted to release the stress. The tensile stress film pattern TS1 is sandwiched between the stress released portions V1 and V2 and the tensile stress film pattern TS2 is sandwiched between the stress released portions V2 and V3.

As the tensile stresses in the stress released portions V1, V2 and V3 are released, the stresses stretching outward the left tensile stress film patterns TS1 and TS2 are extinguished so that the tensile stress film patterns TS1 and TS2 tend to shrink as indicated by arrows. This force exerts the compressive stress on the silicon substrate Sub under the tensile stress film patterns TS1 and TS2. Since a stress stretching outward is generated on both sides of the stress released portion V2, a tensile stress is exerted on the silicon substrate Sub.

In MOSFET, a contact etch stopper film having a tensile stress therein is formed covering the gate electrode. This contact etch stopper film bends toward the direction of spacing apart from the silicon substrate above the channel region, so that it has the structure corresponding to the stress released portion. The tensile stress film on both sides of the gate electrode exerts the tensile stress on the channel region, similar to the stress released portion.

As shown in FIG. 1D, a compressive stress film CS is formed on a flat surface of a silicon substrate Sub. For example, the tensile stress film is a silicon nitride film formed by plasma-enhanced (PE) CVD. Stress is not generated in the silicon substrate Sub whose whole surface is covered with the compressive strain film CS.

As shown in FIG. 1E, the compressive stress film CS shown in FIG. 1D is partially and selectively removed to leave compressing stress film patterns CS1 and CS2 defined by stress released portions V1, V2 and V3 whose compressive stresses are released. The compressive stress film pattern CS1 is sandwiched between the stress released portions V1 and V2 and the compressive stress film pattern CS2 is sandwiched between the stress released portions V2 and V3.

As the compressive stresses in the stress released portions V1, V2 and V3 are released, the stresses of compressing the left compressive stress film patterns CS1 and CS2 are extinguished so that the compressive stress film patterns CS1 and CS2 tend to expand as indicated by arrows. This force exerts the tensile stress on the silicon substrate Sub under the compressive stress film patterns CS1 and CS2. Since a stress directing inward is generated on both sides of the stress released portion V2, a compressing stress is exerted on the silicon substrate Sub.

In MOSFET, a contact etch stopper film having a compressive stress therein is formed covering the gate electrode. Since this contact etch stopper film bends toward the direction of spacing apart from the silicon substrate above the channel region, a compressive stain is exerted on the channel region, similar to the stress released portion.

If ion implantation is to be performed to release stress, atoms or an atom group to be used for ion implantation are preferably such atoms or an atom group which will not electrically influence even it enters silicon. If a silicon substrate is used, homolog elements such as Ge and C or inert elements such as Ar may be used.

FIGS. 2A to 2H are cross sectional views and plan views showing stresses capable of being generated when a tensile stress film is formed on a MOSFET.

Figure 2B:
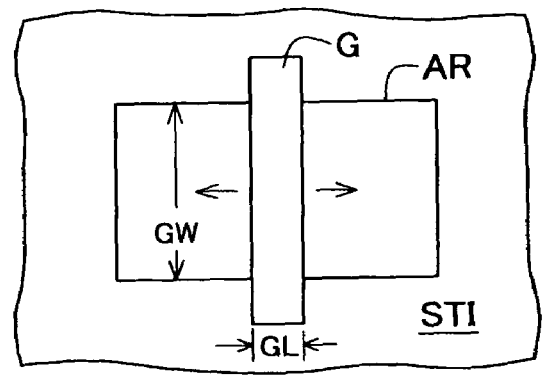

FIGS. 2A and 2B are a cross sectional view and a plan view showing the state that a tensile stress film is formed on the whole MOSFET region. An element isolation region STI formed by shallow trench isolation (STI) is formed in the surface layer of a silicon substrate to define active regions AR. An insulated gate electrode G is formed on the surface of the active region AR, and side wall spacers SW are formed on the side walls of the insulated gate electrode G. A tensile stress film TS (including TS1 and TS2) is formed covering the insulated gate electrode structure. In the plan view, the side wall spacers SW are not shown and are omitted, this being applicable to the succeeding drawings. Although the tensile stress films TS1 and TS2 are in contact with the substrate surface on both sides of the insulated gate electrode structure, the tensile stress film on the insulated gate electrode structure is spaced apart from the substrate surface, constituting a stress released portion V2. Therefore, the tensile stress film patterns TS1 and TS2 tending to shrink exert stresses as indicated by arrows, and the surface of the silicon substrate (channel region) under the insulated gate electrode receives a force directed outward so that the tensile stress is exerted on the channel region.

Figure 2C:
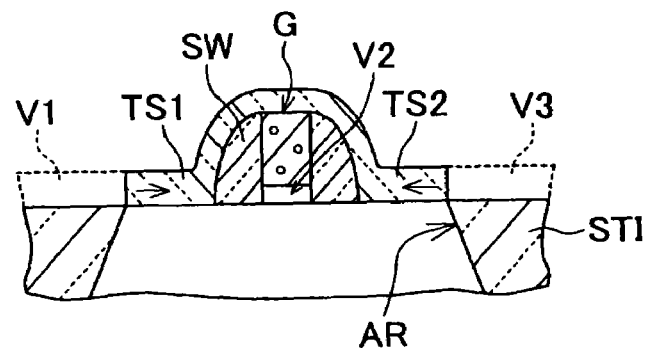
Figure 2D:
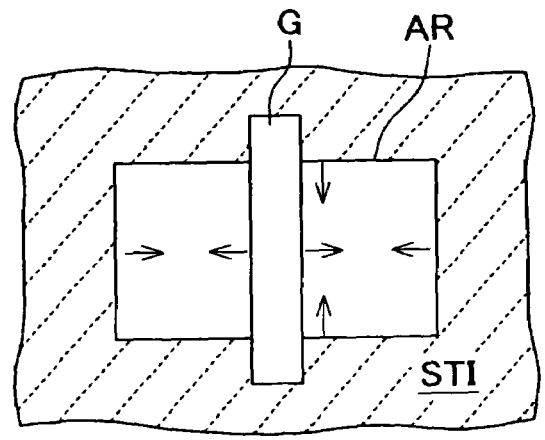

FIGS. 2C and 2D are a cross sectional view and a plan view showing the state that a tensile stress film is formed only on the active region in the MOSFET region and removed from the element isolation region STI. The element isolation region STI, active region AR, insulated gate electrode G and side wall spacers SW are similar to those shown in FIGS. 2A and 2B. The tensile stress film TS is formed and the tensile stress film TS on the element isolation region STI is removed. Stress released portions V1 and V3 with the tensile stress film being removed are indicated by broken lines in FIG. 2D.

In the active regions on both sides of the insulated gate electrode structure, tensile stress film patterns TS1 and TS2 contact the substrate surface, and on the insulated gate electrode structure or in the element isolation region STI, the tensile stress film is spaced apart from the substrate surface or removed, respectively, to form stress released portions V1, V2 and V3. Therefore, the tensile stress film patterns TS1 and TS2 tending to shrink exert stresses outward on both sides of the insulated gate electrode G as indicated by arrows, and the tensile stress is exerted on the channel region under the insulated gate electrode G along the gate length direction.

Along the width direction of the insulated gate electrode G, a force directing toward the inner side of the active region is exerted so that a compressive stress is exerted along the gate width direction.

Figure 2E:
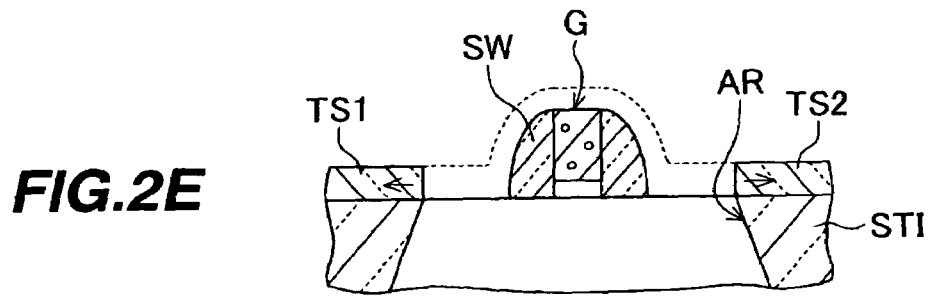
Figure 2F:
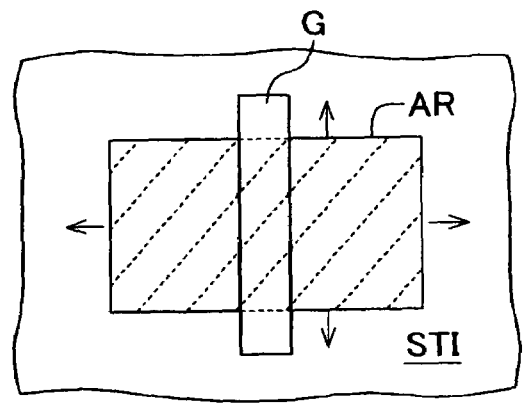

FIGS. 2E and 2F are a cross sectional view and a plan view showing the state that a tensile stress film is formed only on the element isolation region STI in the MOSFET region and removed from the active region. The tensile stress film TS is formed covering the insulated gate electrode structure constituted of the insulated gate electrode G on the silicon surface and the side wall spacers SW on the side walls, and is removed in the active region. The region where the tensile stress film is removed is indicated by a broken line. The other points are similar to those shown in FIGS. 2A to 2D.

The tensile stress film left only on the element isolation region STI tends to shrink so that the stress directing outward near the periphery of the active region AR is exerted. A force directing toward the outside of the active region is exerted along the width direction of the insulated gate electrode G so that the tensile stress is exerted along the gate width direction.

Figure 2G:
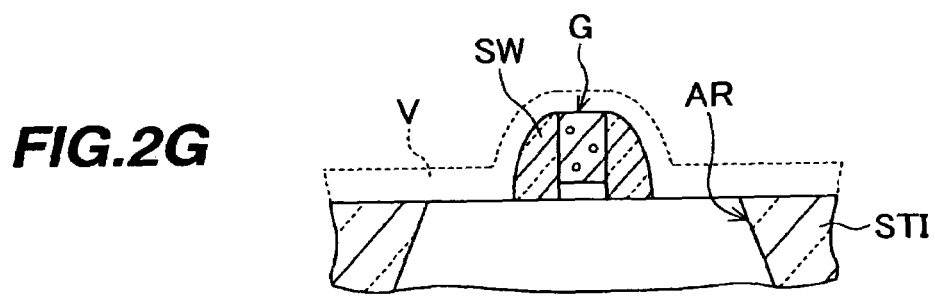
Figure 2H:
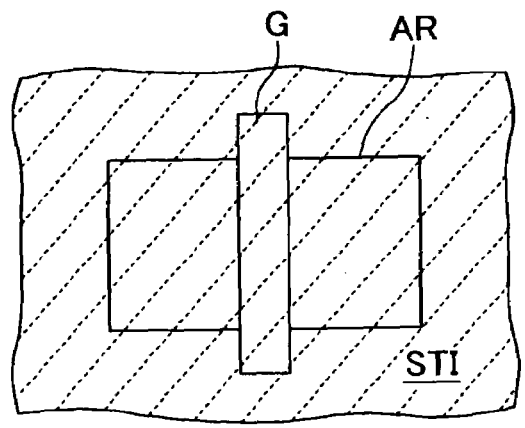

FIGS. 2G and 2H are a cross sectional view and a plan view showing the state that a tensile stress film formed in the MOSFET region is completely removed. A stress will not be exerted because the tensile stress film is completely removed. If this film is removed actually, forming the film is meaningless. However, as described earlier, if ions are implanted into the film to release stresses, this process provides the same effect as removing the film in terms of stress.

If the stress film is made of a contact etch stopper film, the stress film on the element isolation region may be removed or may be left by releasing stresses by ion implantation. The stress film is left on the active region by releasing stresses by ion implantation, because the contact etch stopper film is required to be left on the active region.

FIGS. 3A to 3H are schematic cross sectional views and plan views showing the state that a compressive stress film is formed on MOSFET.

Figure 3A:
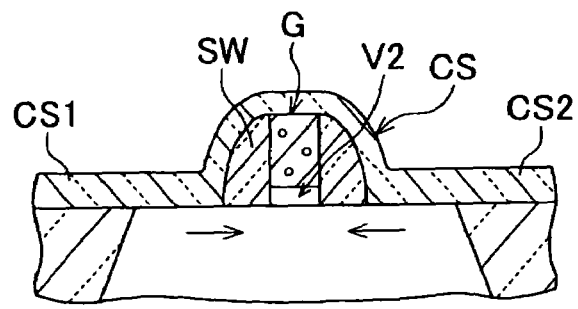
FIGS. 3A to 3H are cross sectional views and plan views showing stresses capable of being generated when a compressive stress film is formed on a MOSFET.
Figure 3B:
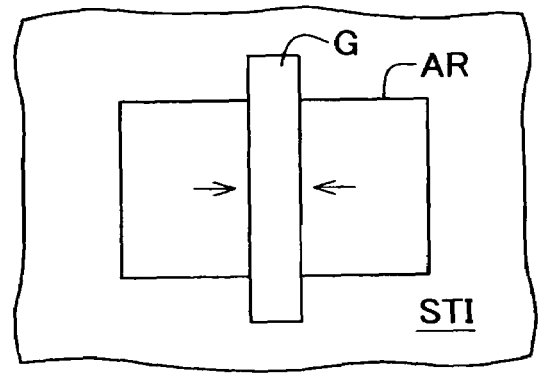

FIGS. 3A and 3B are a cross sectional view and a plan view showing the state that a compressive stress film is formed on the whole MOSFET region. The compressive stress film CS is formed covering the insulated gate electrode structure constituted of an insulated gate electrode G on a silicon surface and side wall spacers SW on the side walls. Although compressive stress films CS1 and CS2 are in contact with the substrate surface on both sides of the insulated gate electrode structure, the compressive stress film on the insulated gate electrode structure is spaced apart from the substrate surface, constituting a stress released portion V2. Therefore, the tensile stress film patterns CS1 and CS2 tending to extend exert stresses as indicated by arrows, and the surface of the channel region under the insulated gate electrode receives a force directed inward so that the compressive stress is exerted on the channel region.

Figure 3C:
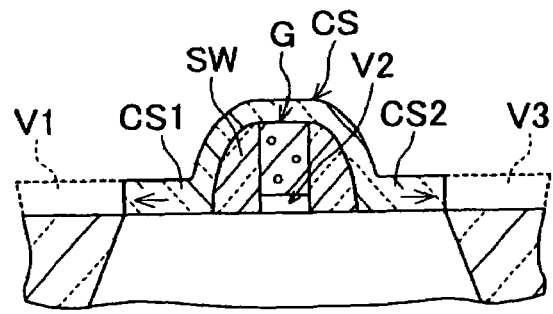
Figure 3D:
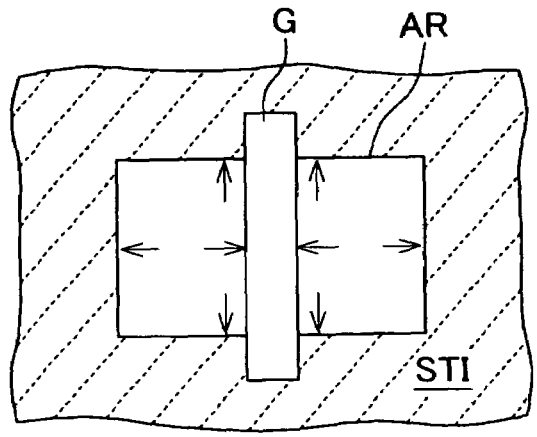

FIGS. 3C and 3D are a cross sectional view and a plan view showing the state that a compressive stress film is formed only on the active region in the MOSFET region and stresses are released from the compressive stress film on the element isolation region STI. The compressive stress film CS is formed covering the insulated gate electrode structure constituted of an insulated gate electrode G on a silicon surface and side wall spacers SW on the side walls, and stresses are released from the compressive stress film on the element isolation region STI. The region where the compressive stress film is removed is indicated by broken lines.

In the active region on both sides of the insulated gate electrode structure, compressive stress film patterns CS1 and CS2 contact the substrate surface, and on the insulated gate electrode structure or in the element isolation region STI, the compressive stress film is spaced apart from the substrate surface, or removed or released from stresses, respectively, to form stress released portions V1, V2 and V3. Therefore, the compressive stress film patterns CS1 and CS2 tending to extend exert stresses inward on both sides of the insulated gate electrode G as indicated by arrows, and the compressive stress is exerted on the channel region under the insulated gate electrode G along the gate length direction. Along the width direction of the insulated gate electrode G, a force directing toward the outer side of the active region is exerted so that a tensile stress is exerted along the gate width direction.

Figure 3E:
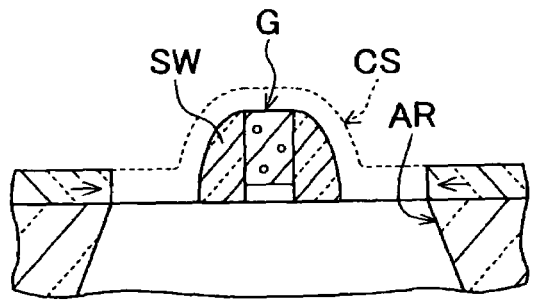
Figure 3F:
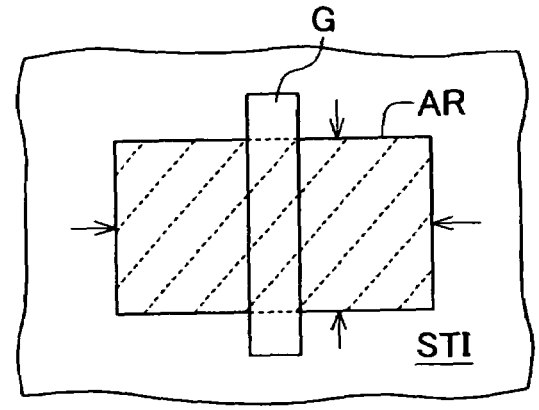

FIGS. 3E and 3F are a cross sectional view and a plan view showing the state that a compressive stress film is disposed only on the element isolation region STI in the MOSFET region and the stress in the film on the active region is released. A compressive film CS is formed covering the insulated gate electrode structure constituted of an insulated gate electrode G on a silicon surface and side wall spacers SW on the side walls, and the stress in the film on the active region AR is released. The region where the compressive stress film is removed is indicated by a broken line.

The compressive stress film left only in the element isolation region STI tends to extend so that a stress directing inward at the periphery of the active region AR is exerted. Along the width direction of the insulated gate electrode G, a force directing toward the inner side of the active region is generated so that a compressive stress is exerted along the gate width direction.

Figure 3G:
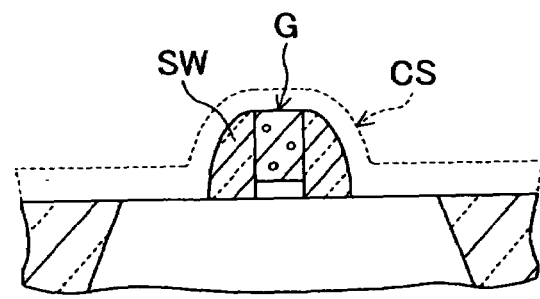
Figure 3H:
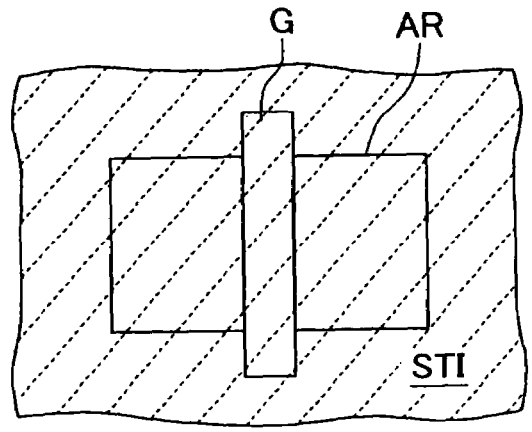

FIGS. 3G and 3H are a cross sectional view and a plan view showing the state that a compressive stress film formed in the MOSFET region is completely removed in terms of stress. A stress will not be exerted because the compressive stress film is completely removed.

FIG. 4A is a table summarizing the above-described study results. This table shows strains in the gate length direction, depth direction and gate width direction when stresses in a stress film formed in the MOSFET region are selectively released. Strain in the depth direction is complementary with strain in the gate length direction. A stress film is selected from this table in order to obtain desired strains in a semiconductor device. In a MOSFET formed on the (001) plane of a silicon substrate and having the <110> direction as the gate length direction, the tensile strain along the gate length direction and gate width direction increases the on-current of an n-MOS, and the compressive strain along the gate length direction and the tensile strain along the gate width direction increase the on-current of a p-MOS.

In order to exert a predetermined (e.g., tensile) stress along the gate length direction, a stress film having a predetermined (e.g., tensile) stress is formed and stresses in the stress film on the active region are required to be released. In order to exert a tensile stress along the gate width direction, a tensile stress film is formed and stresses in the tensile stress film on the STI region are required to be released.

FIG. 4B shows an example of contact plugs. Side wall spacers SW are formed on the side walls of a gate electrode G above the active region AR, and source/drain diffusion layers 19 are formed in the active region on both sides of the side wall spacers. For example, a compressive stress film is formed covering the insulated gate electrode structure and stresses are released from the compressive stress film on the element isolation region STI. Contact holes CH and conductive plugs filled in the contact holes are formed separately along the gate width direction, in the example shown, at two selected positions of each of the source/drain diffusion layers, leaving spaces SP on both sides and the middle of the two positions. Although the compressive stress film in contact with the silicon surface is removed in the region where the side wall spacer SW and contact hole CH contact, the compressive stress film is left on the spaces SP. As the compressive stress film on the STI region is removed, the compressive stress film tends to extend so stresses indicated by arrows are exerted and a desired strain can be given to the silicon substrate.

Figure 5A:
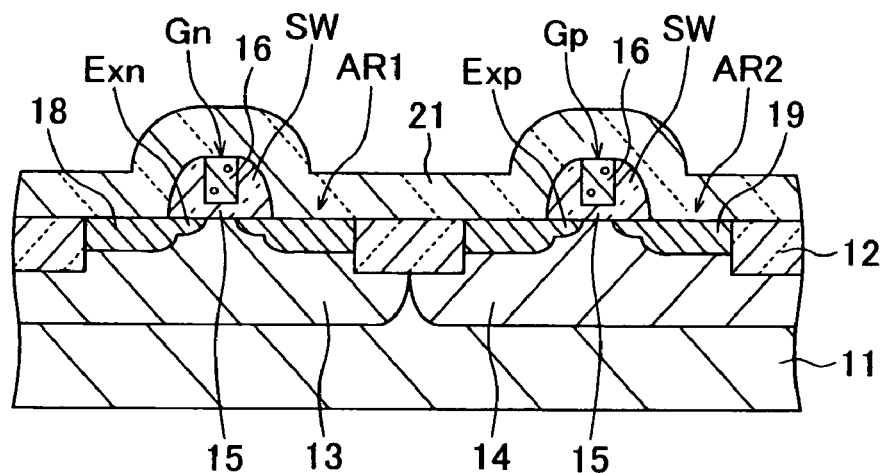
FIGS. 5A to 5D are cross sectional views and a plan view of a semiconductor device according to a first embodiment.

FIGS. 5A to 5D are cross sectional views and a plan view showing a CMOS structure according to the first embodiment. As shown in FIG. 5A, a trench is formed in the surface layer of a (001) plane p-type silicon substrate, an insulating layer is buried in the trench and thereafter an unnecessary region is removed to form an element isolation region 12 defining active regions by shallow trench isolation (STI). Impurities of p- and n-types are selectively implanted to form a desired p-well 13 and n-well 14. The surface of the active region is thermally oxidized and if necessary nitridized to form a gate insulating film 15.

A polysilicon layer is deposited on the gate insulating film to a thickness of, e.g., about 100 nm to form a gate electrode layer. By using a resist pattern, the gate electrode layer and gate insulating film are patterned to form an insulated gate electrode G (collectively indicating Gn and Gp) having a gate length of, e.g., 50 nm along the <110> direction. Impurities of n- and p-types are selectively implanted into the active regions on both sides of the insulated gate electrode G to form an n-type extension Exn and a p-type extension Exp.

An insulating film such as an oxide film is deposited covering the insulated gate electrode G, and anisotropic etching is performed to leave side wall spacers SW only on the side walls of the insulated gate electrode G. By using the side wall spacers SW as a mask, n-type impurities and p-type impurities are selectively implanted to form an n-type source/drain diffusion layer 18 and a p-type source/drain diffusion layer 19. Impurities are also implanted into the gate electrodes to form an n-type gate electrode Gn in the n-MOS region and a p-type gate electrode Gp in the p-MOS region. If necessary, a metal layer such as Co capable of being silicidated is deposited and a silicidation process is performed to form silicide layers on the gate electrode G and source/drain diffusion layers.

Covering the CMOS structure formed in this manner, a contact etch stopper film 21 of a silicon nitride film having a tensile stress is deposited by thermal CVD. For example, the silicon nitride film 21 having a thickness of about 80 nm and a tensile stress of 1.4 GPa therein is formed by thermal CVD under the conditions that dichlorosilane (DCS)+monosilane ($SiH_4$)+disilane ($Si_2H_6$)+$Si_2H_4$ are flowed at 5 to 50 sccm as silicon source gas, $NH_3$ is flowed at 500 to 10000 sccm as nitrogen source gas, and $N_2$+Ar are flowed at 500 to 10000 sccm as other gasses, at a pressure of 0.1 to 400 torr and a temperature of 500 to 700° C.

Figure 5B:
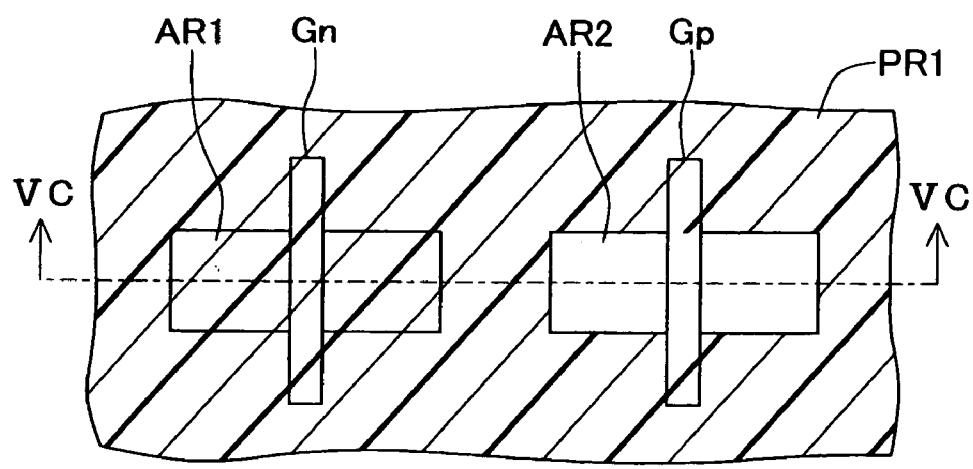

FIG. 5B is a plan view corresponding to FIG. 5A. The element isolation region 12 defines active regions AR1 and AR2 and the insulated gate electrodes Gn and Gp are formed traversing the central areas of the active regions. The side wall spacers SW and silicon nitride film 21 are shown omitted. On the nitride film 21 having a tensile stress, a resist film is coated, selectively exposed and developed to form a resist pattern PR1 having an opening above the p-MOS active region AR2.

Figure 5C:
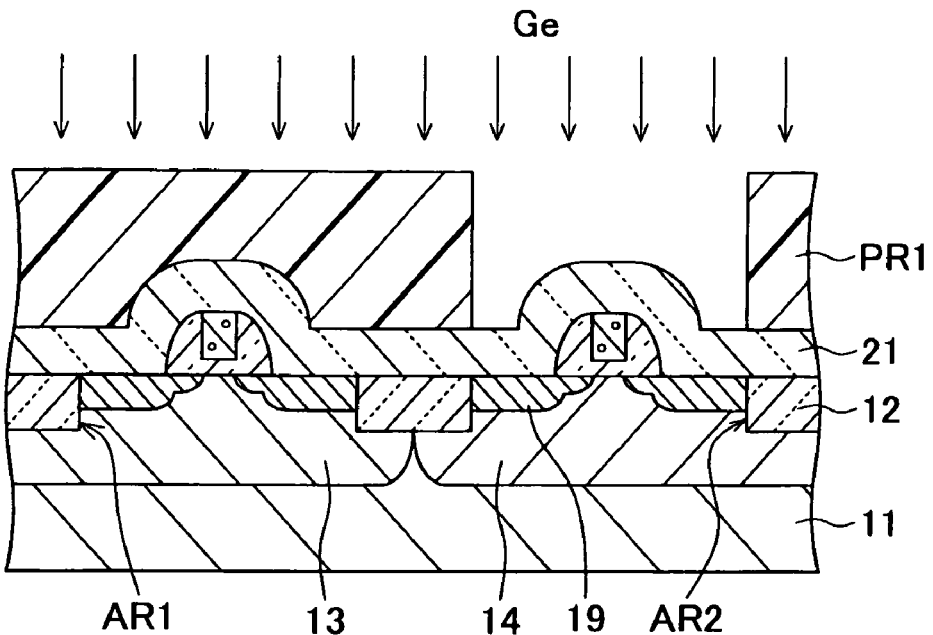

FIG. 5C is a cross sectional view taken along line VC-VC shown in FIG. 5B. As shown in FIG. 5C, the resist pattern PR1 having an opening above the p-MOS active region AR2 is formed. By using the resist pattern PR1 as a mask, Ge ions are implanted at an acceleration energy of 100 keV and a dose of $5×10^{14}$ atoms/cm$^2$ to selectively release stresses in the silicon nitride film 21 in the p-MOS active region AR2.

Figure 5D:
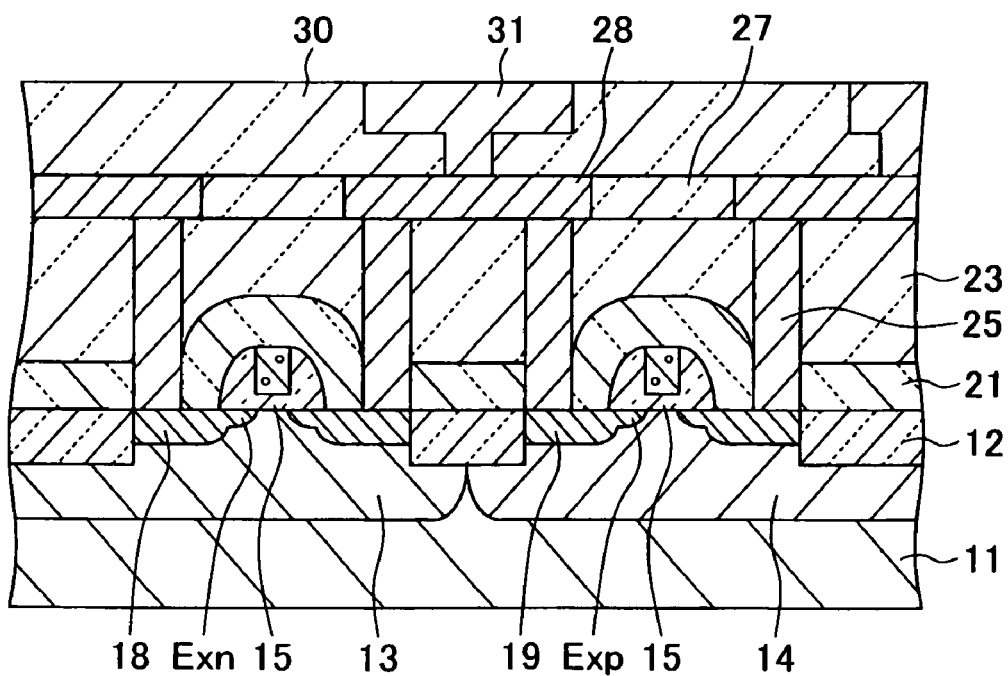

As shown in FIG. 5D, an interlayer insulating film 23 of silicon oxide or the like is formed on the silicon nitride film 21 by a well-known process, and the interlayer insulating film is etched to form contact holes by using the silicon nitride film 21 as the contact etch stopper film and conductive plugs 25 are buried in the contact holes. An interlayer insulating film 27 is deposited covering the conductive plugs 25, and trenches are formed and buried with a copper wiring 28. An interlayer insulating film 30 is formed covering the copper wiring 28, and a trench and a via hole are formed and buried with a copper wiring 31. The interlayer insulating film forming process and wiring forming process are repeated a necessary number of times to complete a CMOS structure. These wiring forming processes are performed by well-known techniques.

With this CMOS structure, since the n-MOS region is covered with the silicon nitride film having the tensile stress, tensile stress is generated along the gate length direction so that the on-current increases. In the p-MOS region, since the tensile stress is released in the active region, the tensile strain is generated along the gate width direction so that the on-current increases. The performance of both n-MOSFET and p-MOSFET is improved and the performance of the whole CMOS is improved.

In the first embodiment, although the p-MOS region is covered with the contact etch stopper film having the tensile stress, the stress is released for the active region so that the tensile strain is generated in the channel region along the gate width direction and the on-current of p-MOSFET increases. This effect relies mainly upon stress release along the gate width direction, and is not strict along the gate length direction.

Figure 6A:
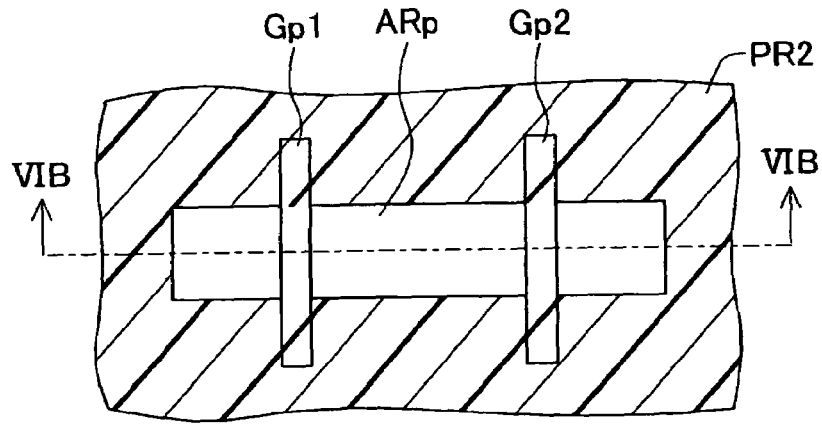
FIGS. 6A to 6F are cross sectional views and plan views showing modifications of the first embodiment.
Figure 6B:
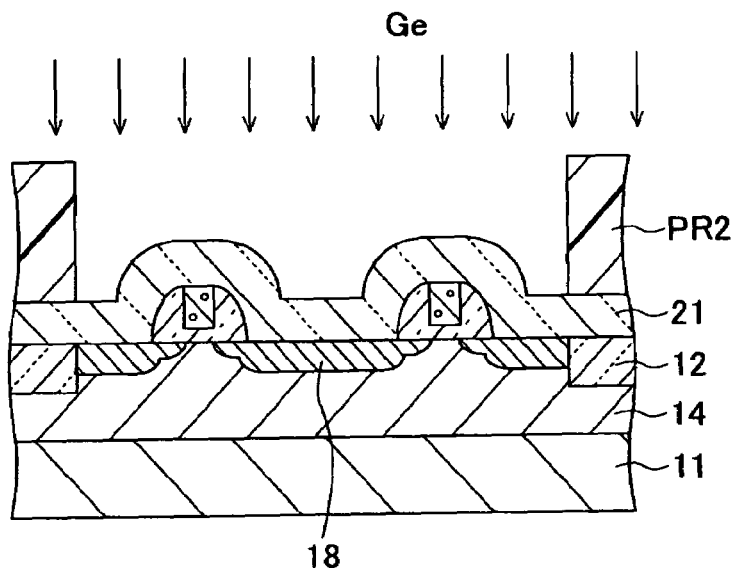

FIGS. 6A and 6B show an application example to a NOR type CMOS circuit. As shown in FIG. 6A, a plurality of insulated gate electrodes Gp1 and Gp2 are formed traversing a laterally long p-MOS active region ARp. The active region between adjacent insulated gate electrodes functions as the common source/drain region of two p-MOS transistors. A resist pattern PR2 for Ge ion implantation has an opening aligned with the active region ARp. As shown in FIG. 6B, Ge ions are implanted into the active region ARp by using a resist pattern PR2 opening a plurality of coupled p-MOS transistors.

Figure 6C:
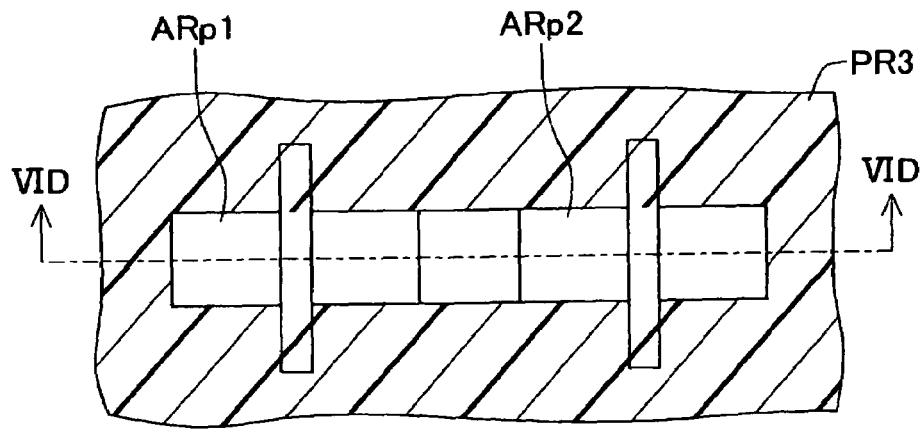
Figure 6D:
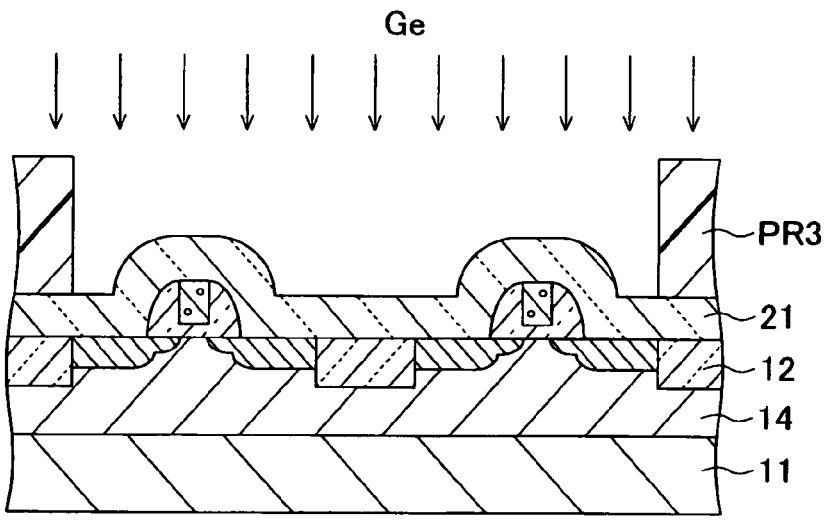

FIGS. 6C and 6D show a first modification of the first embodiment. When two p-MOS active regions ARp1 and ARp2 are juxtaposed along the gate length direction, the element isolation region therebetween may be covered with a resist region, or may be exposed in the opening as shown. A resist pattern PR3 is formed which exposes or opens the juxtaposed two p-MOS active regions ARp1 and Arp2 and covers the element isolation region 12 with respect to the gate width direction. As shown in FIG. 6D, Ge ions are implanted by using the resist pattern PR3 as a mask. Since the tensile stress above the active regions ARp1 and ARp2 is released, the tensile strain is not generated in the channel region along the gate length direction. The tensile stress left above the element isolation region 12 along the gate width direction exerts the tensile strain on the channel region along the gate width direction so that the on-current increases.

Figure 6E:
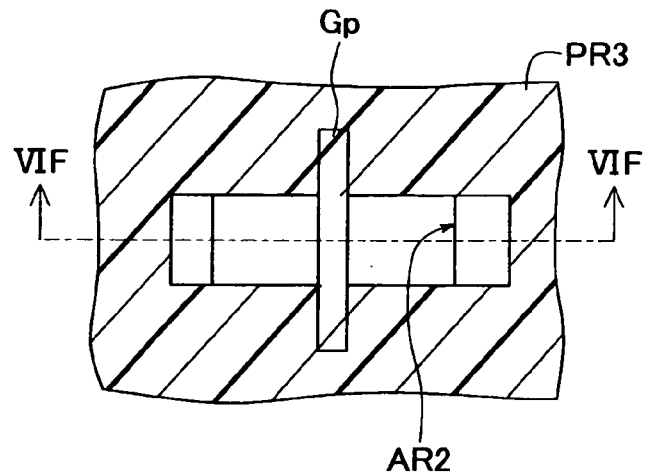
Figure 6F:
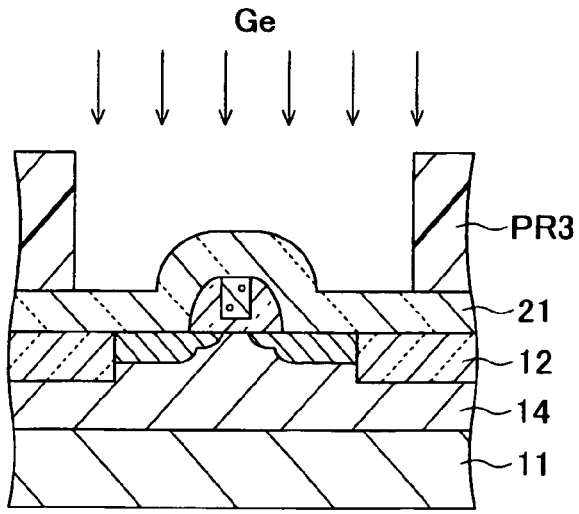

FIGS. 6E and 6F show a second modification of the first embodiment. A resist pattern PR3 opening the p-MOS active region AR2 also partially opens the element isolation region 12 along the gate length direction. Even by this resist pattern, the tensile stress above the active region is released by Ge ion implantation and the tensile stress film left on the element isolation region 12 along the gate width direction exerts the tensile strain on the channel region.

Figure 7A:
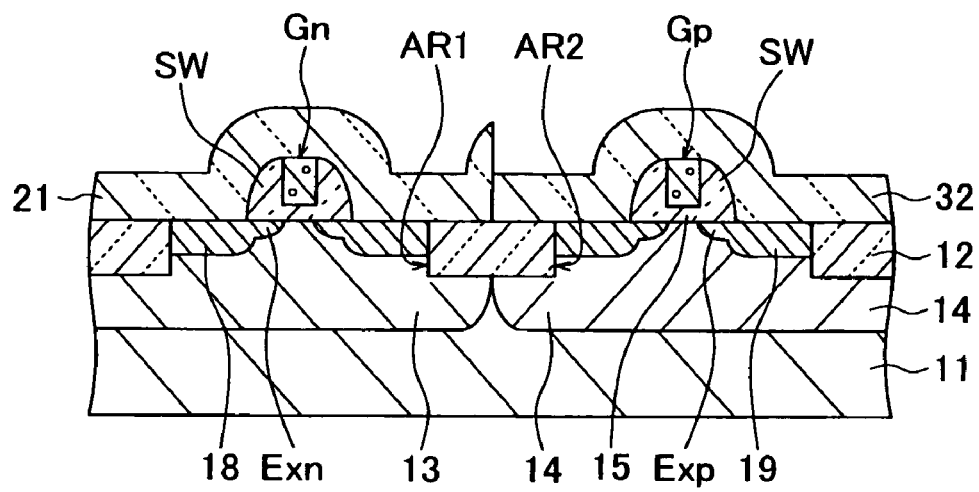
FIGS. 7A to 7D are cross sectional views and a plan view of a semiconductor device according to a second embodiment.

FIGS. 7A to 7D are schematic cross sectional views and a plan view showing the structure of a semiconductor device of the second embodiment and its main manufacture processes. As shown in FIG. 7A, by the processes similar to those of the first embodiment, the constituent elements are formed including: an element isolation region 12 by shallow trench isolation (STI) defining active regions AR1 and AR2 in the surface layer of a (001) plane p-type silicon substrate 11; a p-well 13, an n-well 14; and an insulated gate electrode G (Gn, Gp) constituted of a gate insulating film 15 and a polysilicon layer. Impurities of n- and p-types are selectively implanted into the active region on both sides of the insulated gate electrode G to form an n-type extension Exn and a p-type extension Exp, and side wall spacers SW are formed on the side walls of the insulated gate electrode G.

By using the side wall spacers SW as a mask, n-type and p-type impurity ions are selectively implanted to form an n-type gate electrode Gn and an n-type source/drain diffusion layer 18 of an n-MOS and a p-type gate electrode Gp and a p-type source/drain diffusion layer 19 of a p-MOS. If necessary, a metal layer such as Co capable of being silicidated is deposited and a silicidation process is performed to form silicide layers on the gate electrode G and source/drain diffusion layers. These processes are similar to those of the first embodiment.

In the second embodiment, a silicon nitride film 21 having a tensile stress is formed in the n-MOS region and a silicon nitride film 32 having a compressive stress is formed in the p-MOS region.

The silicon nitride film 32 having a compressive stress is deposited on the silicon substrate, covering the insulated gate electrodes Gn and Gp. For example, the silicon nitride film 32 having the compressive stress of about 1.4 GPa is deposited to a thickness of about 80 nm by PECVD under the conditions that $SiH_4$ is flowed at 100 to 1000 sccm as silicon source gas, $NH_3$ is flowed at 500 to 10000 sccm as nitrogen source gas, and Ar+$N_2$ are flowed at 500 to 10000 sccm as other gasses, at a pressure of 0.1 to 400 torr and an RF power of 100 to 1000 W.

By covering the p-MOS region with a resist pattern, the compressive stress silicon nitride film 32 in the n-MOS region is removed. Next, the silicon nitride film 21 having a thickness of about 80 nm and a tensile stress of 1.4 GPa is formed by thermal CVD like the first embodiment. By covering the n-MOS region with a resist pattern, the exposed tensile stress silicon nitride film 21 in the p-MOS region is removed. In this manner, the structure shown in FIG. 7A is obtained. The silicon nitride film 21 having the tensile stress may be formed first and the tensile stress silicon nitride film 21 in the p-MOS region is removed, and then the silicon nitride film 32 having the compressive stress is deposited and the compressive stress silicon nitride film 32 in the n-MOS region may be removed.

Figure 7B:
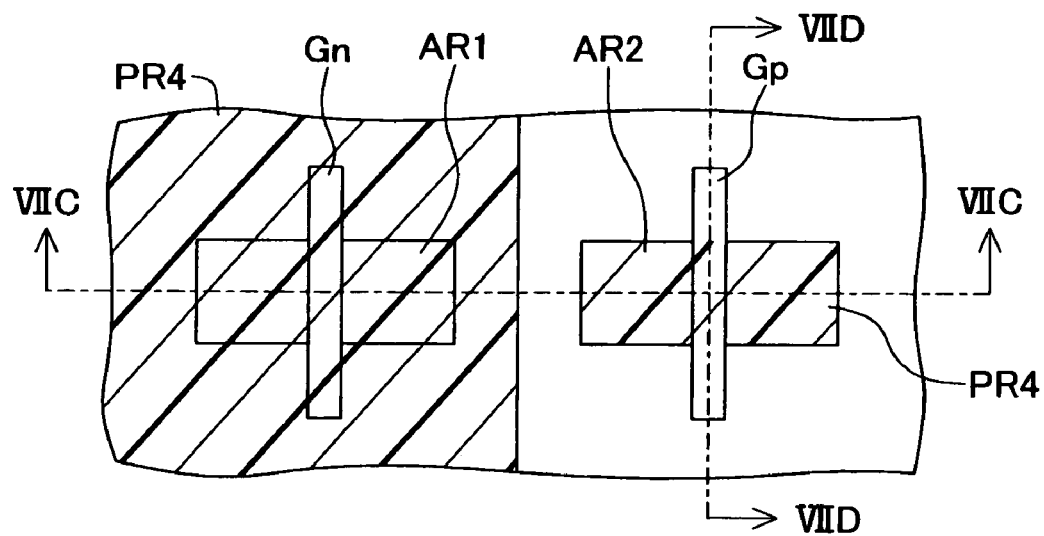

As shown in FIG. 7B, a resist pattern PR4 is formed which covers the whole n-MOS region and the active region in the p-MOS region. The element isolation region 12 in the p-MOS region is therefore exposed.

Figure 7C:
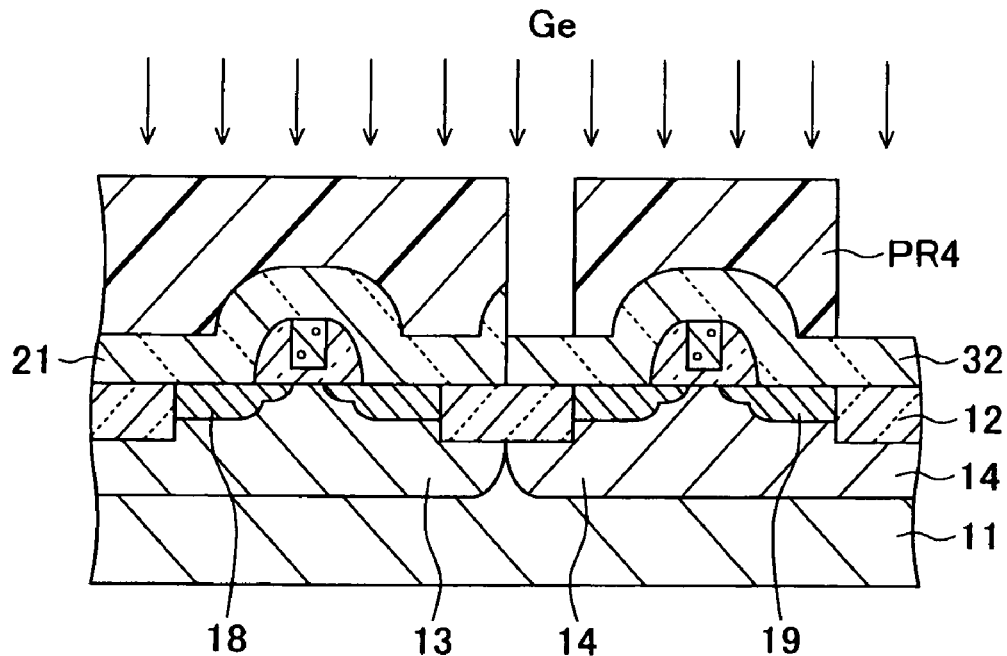
Figure 7D:
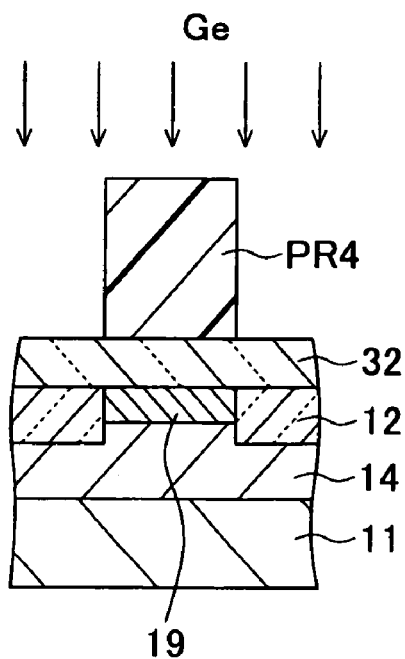

As shown in FIGS. 7C and 7D, Ge ions are implanted at an acceleration energy of 100 keV and a dose of $5 \times 10^{14}$ atoms/cm$^2$ to release the compressive stress in the compressive stress silicon nitride film 32 on the element isolation region 12 in the p-MOS region. FIG. 7C is a cross sectional view taken along the gate length direction and FIG. 7D is a cross sectional view taken along the gate width direction.

The compressive stress silicon nitride film 32 left on the active region AR2 in the p-MOS region exerts the compressive stress on the channel region under the insulated gate electrode Gp along the gate length direction. Since the compressive stress above the element isolation region along the gate width direction is released, the extending force of the compressive stress silicon nitride film 32 selectively left on the active region AR2 generates the tensile strain along the gate width direction so that the on-current of the p-MOS transistor increases.

According to the second embodiment, the n-MOS transistor is similar to that of the first embodiment. The p-MOS region is covered with the contact etch stopper film having the compressive stress and the stress above the element isolation region is released. Therefore, the compressive strain is generated in the channel region of the p-MOS region along the gate length direction and the tensile strain is generated along the gate width direction. It is expected that the performance of the p-MOS transistor is improved further.

Figure 8A:
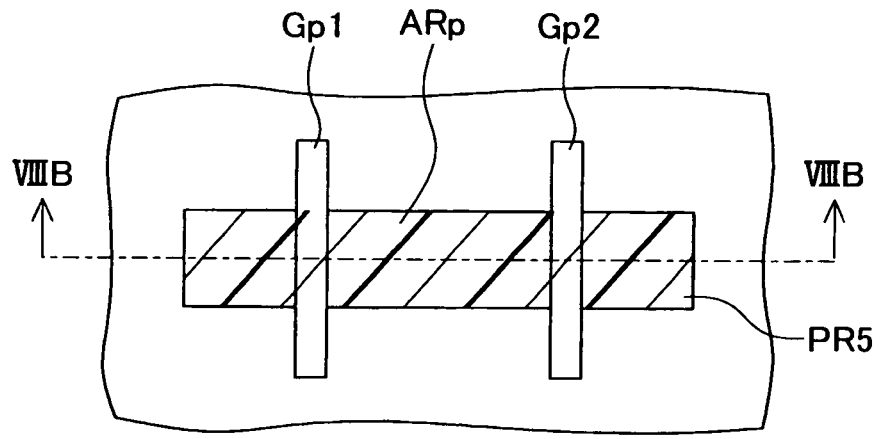
FIGS. 8A to 8F are cross sectional views and plan views showing modifications of the second embodiment.
Figure 8B:
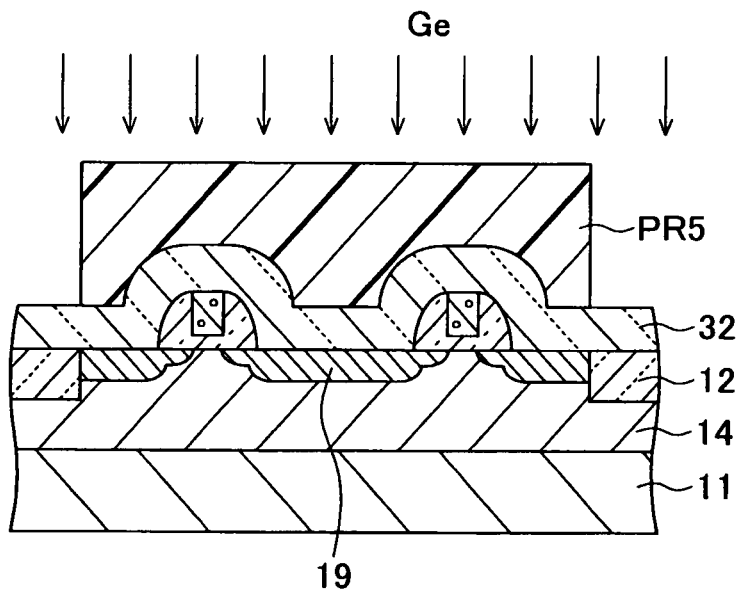

FIGS. 8A and 8B show an application example to a NOR type CMOS circuit. As shown in FIG. 8A, a plurality of insulated gate electrodes Gp1 and Gp2 are formed traversing a laterally long p-MOS active region ARp. A resist pattern PR5 for Ge ion implantation exposes the element isolation region in the p-MOS region. As shown in FIG. 8B, by using the resist pattern PR5 masking a plurality of couples p-MOS transistors, Ge ions are implanted into the element isolation region 12.

Figure 8C:
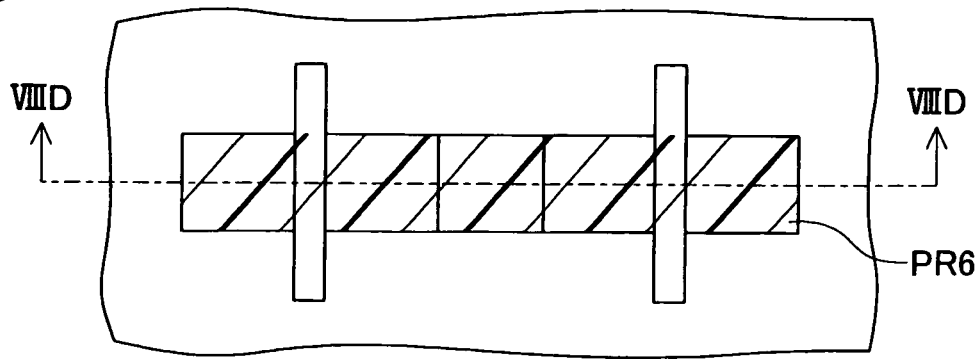
Figure 8D:
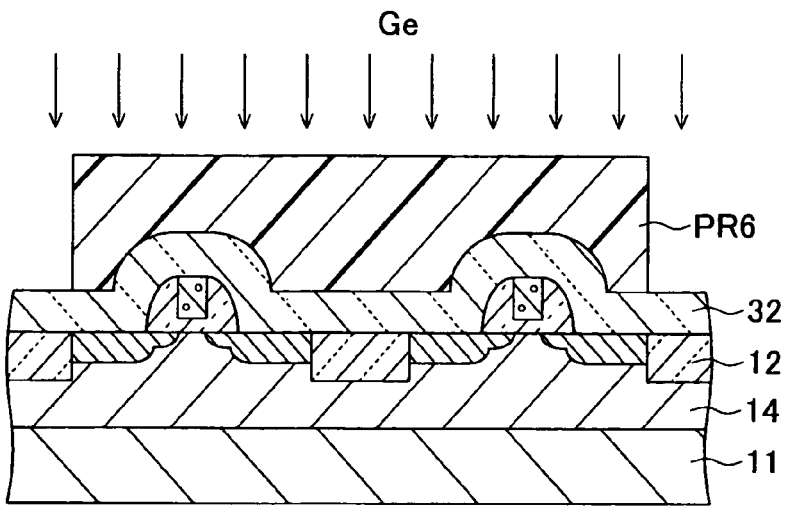

FIGS. 8C and 8D show a first modification of the second embodiment. When two p-MOS active regions ARp1 and ARp2 are juxtaposed along the gate length direction, the element isolation region therebetween may be covered with a resist region, or may be exposed or opened as shown. A resist pattern PR6 is formed which covers the juxtaposed two p-MOS active regions ARp1 and ARp2 with respect to the gate width direction. As shown in FIG. 8D, Ge ions are implanted by using the resist pattern PR6 as a mask. Since the compressive stress above the element isolation region 12 outside of the active regions ARp1 and ARp2 is released, the tensile strain is generated in the channel region along the gate width direction.

Figure 8E:
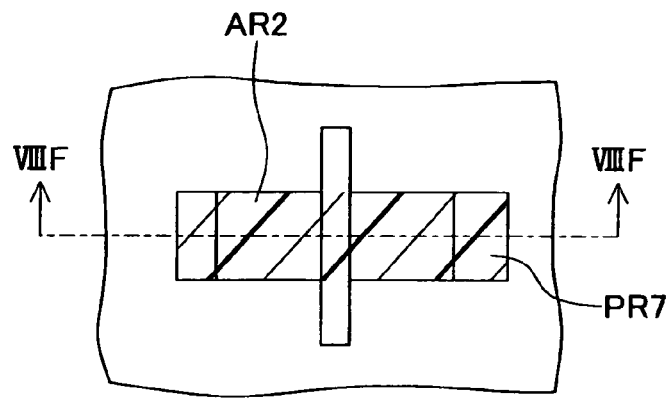
Figure 8F:
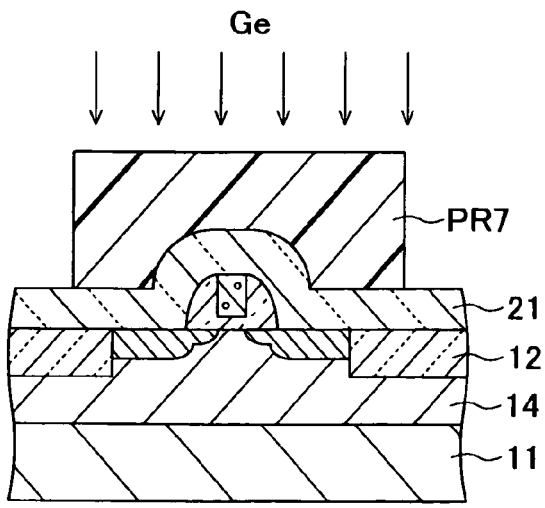

FIGS. 8E and 8F show a second modification of the second embodiment. A resist pattern PR7 covering the p-MOS active region AR2 is removed in the element isolation region 12 along the gate width direction. However, the resist pattern PR7 extends on the element isolation region 12 along the gate length direction. Even with this resist pattern, the compressive stress above the element isolation region is released by Ge ion implantation and the compressive strain along the gate length direction and the tensile strain along the gate width direction are generated in the channel region.

FIGS. 9A to 9D are schematic cross sectional views and a plan view showing the structure of a semiconductor device of the third embodiment and its main manufacture processes. As shown in FIG. 9A, by the processes similar to those of the first embodiment, the constituent elements are formed including: an element isolation region 12 by shallow trench isolation (STI) defining active regions AR1 and AR2 in the surface layer of a (001) plane p-type silicon substrate 11; a p-well 13, an n-well 14; and an insulated gate electrode G (Gn, Gp) constituted of a gate insulating film 15 and a polysilicon layer 16. Impurities of n- and p-types are selectively implanted into the active region on both sides of the insulated gate electrode G to form an n-type extension Exn and a p-type extension Exp, and side wall spacers SW are formed on the side walls of the insulated gate electrode G.

By using the side wall spacers SW as a mask, n-type and p-type impurity ions are selectively implanted to form an n-type gate electrode Gn and an n-type source/drain diffusion layer 18 of an n-MOSFET and a p-type gate electrode Gp and a p-type source/drain diffusion layer 19 of a p-MOSFET. If necessary, a metal layer such as Co capable of being silicidated is deposited and a silicidation process is performed to form silicide layers on the gate electrode G and source/drain diffusion layers 18 and 19. A silicon nitride film 21 having a tensile stress is formed in the n-MOS region and a silicon nitride film 32 having a compressive stress is formed in the p-MOS region. These processes are similar to those of the second embodiment.

As shown in FIG. 9B, a resist pattern PR8 is formed which covers the whole n-MOS region and the active region in the p-MOS region. The element isolation region 12 in the p-MOS region is therefore exposed. As shown in FIGS. 9C and 9D, the compressive stress silicon nitride film 32 is etched to release the compressive stress in the compressive stress silicon nitride film 32 in the element isolation region 12 in the p-MOS region. FIG. 9C is a cross sectional view taken along the gate length direction and FIG. 9D is a cross sectional view taken along the gate width direction. The compressive stress silicon nitride film 32 left on the active region AR2 in the p-MOS region exerts the compressive stress on the channel region under the insulated gate electrode Gp along the gate length direction.

Since the compressive stress above the element isolation region along the gate width direction is released, the extending force of the compressive stress silicon nitride film 32 selectively left on the active region AR2 exerts a force directing toward the outside so that the tensile strain along the gate width direction is generated and the on-current of the p-MOS transistor increases.

According to the third embodiment, the n-MOS transistor is similar to that of the first embodiment. The compressive strain is generated in the channel region of the p-MOS region along the gate length direction and the tensile strain is generated along the gate width direction. It is expected that the performance of the p-MOS transistor is improved further.

FIGS. 10A to 10D are schematic cross sectional views and a plan view showing the structure of a semiconductor device of the fourth embodiment and its main manufacture processes.

Figure 10A:
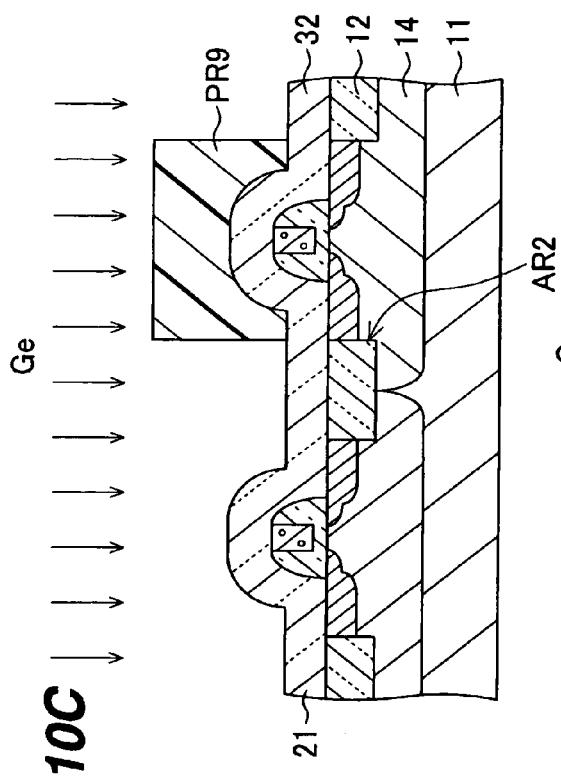
FIGS. 10A to 10D are cross sectional views and a plan view of a semiconductor device according to a fourth embodiment.

As shown in FIG. 10A, an n-MOSFET and a p-MOSFET are formed on a semiconductor substrate 11 by the processes similar to those of the above-described embodiments. A contact etch stopper film 32 of a silicon nitride film having a compressive stress is formed on the semiconductor substrate.

Figure 10B:
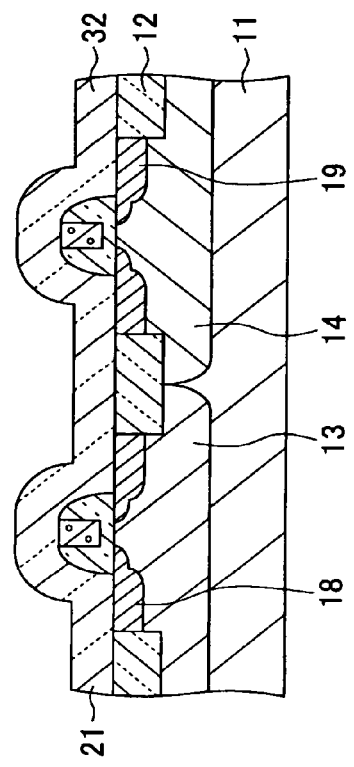

FIG. 10B is a plan view of the semiconductor substrate as viewed from the upper position. An element isolation region 12 by STI defines an n-MOS active region AR1 and a p-MOS active region AR2. Gate electrode structures Gn and Gp are formed traversing the active regions AR1 and AR2.

Figure 10C:
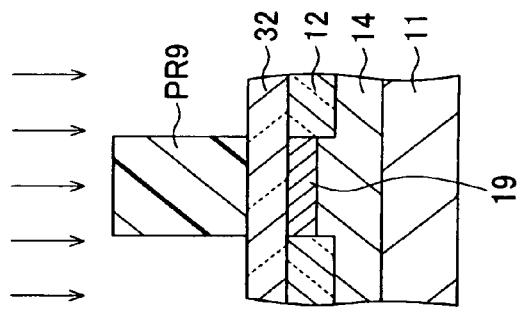

As shown in FIG. 10C, a compressive stress film 32 is formed on the whole surface of the semiconductor substrate, covering the gate electrode structures. A resist pattern is formed on the compressive stress film 32. The resist pattern PR9 is formed only in the p-MOS active region AR2.

Figure 10D:
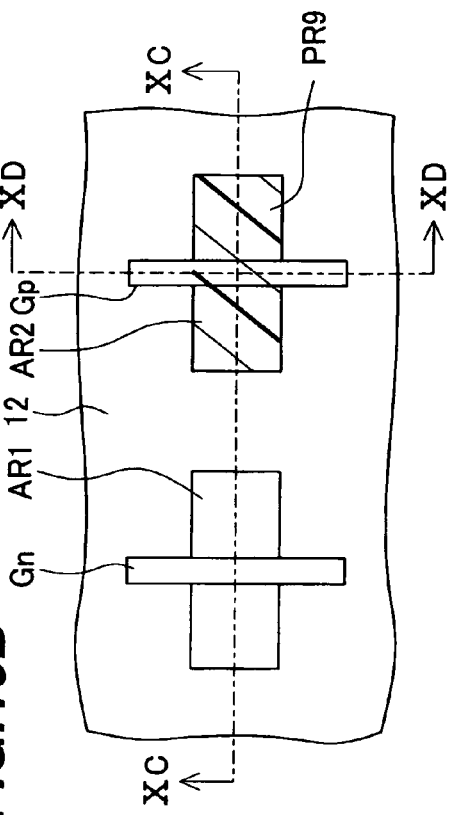

As shown in FIGS. 10C and 10D, by using the resist pattern PR9 as a mask, Ge ions are implanted. FIG. 10C is a cross sectional view taken along the gate length direction and FIG. 10D is a cross sectional view taken along the gate width direction.

In the n-MOS region, the stress in the contact etch stopper film is released so that a reduction in the on-current to be caused by the compressive stress can be suppressed. In the p-MOS region, only the stress above the element isolation region 12 is released. The compressive stress film left on the active region tends to extend outward. The compressive stress is exerted along the gate length direction, and the tensile stress is exerted along the gate width direction. Therefore, the on-current of the p-MOSFET increases.

Figure 11B:
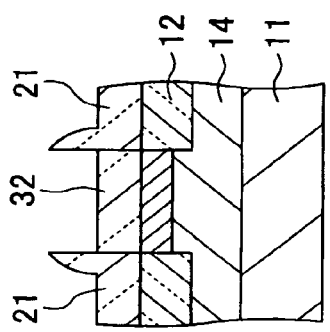
FIGS. 11A to 11C are cross sectional views and a plan view of a semiconductor device according to a fifth embodiment.
Figure 11A:
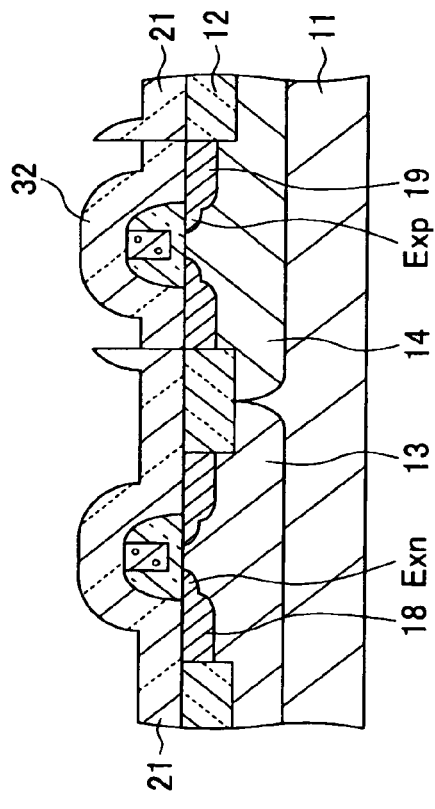
Figure 11C:
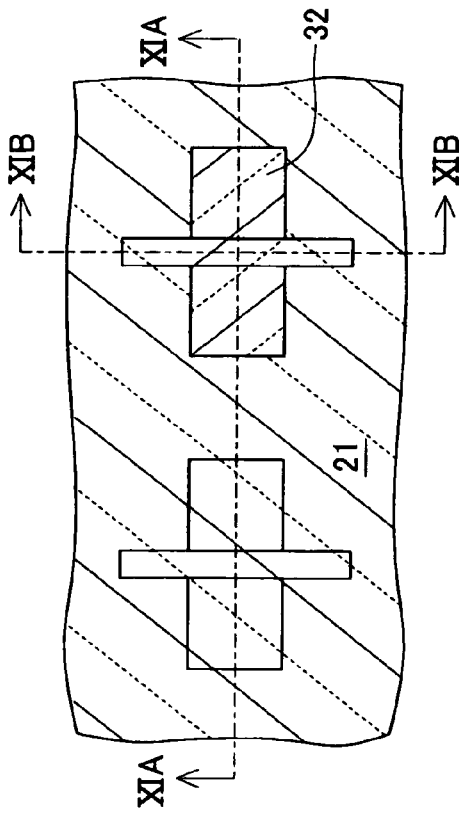

FIGS. 11A to 11C are schematic cross sectional views and a plan view showing the structure of a semiconductor device of the fifth embodiment. FIGS. 11A and 11B are cross sectional views taken along the gate length direction and gate width direction, and FIG. 11C is a plan view. In this embodiment, a contact etch stopper film 32 of a compressive stress film is formed only in the p-MOS region, and a contact etch stopper film 21 of a tensile stress film is formed in the whole n-MOS region and on the element isolation region in the p-MOS region.

In an n-MOSFET, the tensile stress is exerted along the gate length direction so that the on-current increases. In a p-MOSFET, it can be considered that stresses in the compressive film 32 on the element isolation region are released and stresses in the tensile stress film 21 in the active region are released. Namely, the contact etch stopper films 21 and 32 exert a force of extending outward at the periphery of the active region. Therefore, the p-MOSFET receives the compressive stress along the gate length direction and the tensile stress along the gate width direction and increases the on-current.

Figures 12, 13:
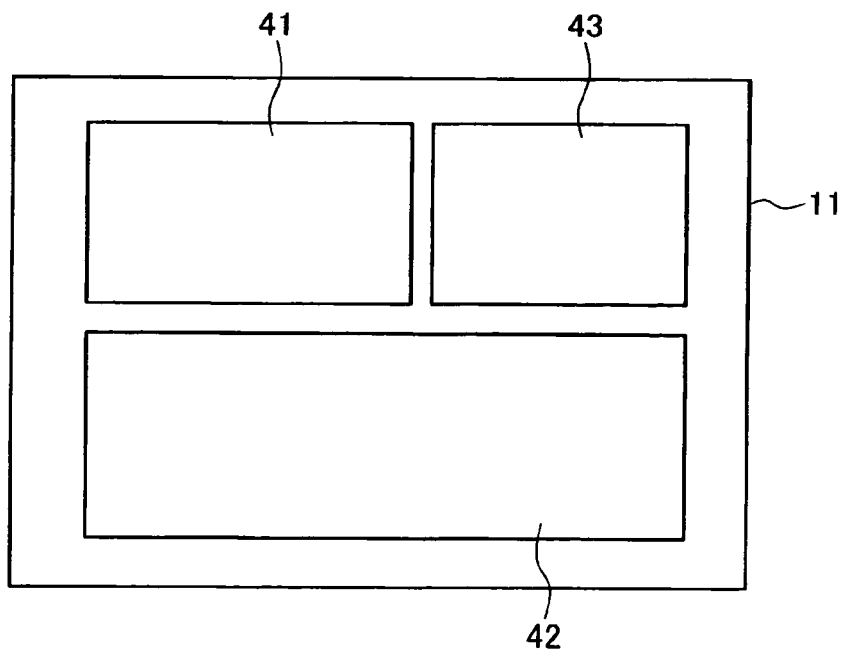
FIG. 12 is a table summarizing the characteristics of the first to fifth embodiments.
FIG. 13 is a plan view illustrating an application example of each embodiment to a semiconductor integrated circuit device.

FIG. 12 is a table summarizing the features of the above-described five embodiments. In order to exert the tensile stress along the gate length direction of an n-MOSFET, it is necessary to form a tensile stress film on the active region. If the stress above the element isolation region is released, the compressive stress is exerted along the gate width direction. Since this is not preferable, the stress released region is "none". The stress is not exerted along the gate width direction. The embodiments E1, E2, E3 and E5 correspond to this arrangement.

In the embodiment E4, since the compressive stress in the compressive stress film is released in the whole region, stress will not be exerted in the n-MOS region. A decrease in the on-current to be caused by the compressive stress is prevented.

In order to exert the tensile stress on an n-MOSFET along the gate width direction, if the tensile stress film is used, the stress above the active region is released. However, in this case, the stress along the gate length direction is "none" and the effects are cancelled out. If the compressive stress film is used, the stress above the element isolation region is released. However, in this case, if the compressive stress film is left on the active region, the compressive stress is exerted along the gate length direction and the effects are cancelled out. In the embodiments, this arrangement is not adopted.

In order to exert the compressive stress on a p-MOSFET along the gate length direction, it is necessary to form the compressive stress film at least on the active region. The embodiments E2, E3, E4 and E5 adopt this arrangement.

In order to exert the tensile stress along the gate width direction, if the tensile film is used, the stress above the active region is released. The embodiments E1 and E5 adopt this arrangement. If the compressive stress film is used, the stress above the element isolation region is released. The embodiments E2, E3, E4 and E5 adopt this arrangement.

The embodiment E1 uses only the tensile stress film. In an n-MOSFET, the tensile stress is exerted along the gate length direction, and in a p-MOSFET, the tensile stress is exerted along the gate width direction.

The embodiment E4 uses only the compressive stress film. In a p-MOSFET, the compressive stress is exerted along the gate length direction and the tensile stress is exerted along the gate width direction. In a p-MOSFET, however, the stress is not exerted. The other embodiments E2, E3 and E5 use the tensile stress film and compressive stress film. In an n-MOSFET, the tensile stress is exerted along the gate length direction, and in a p-MOSFET, the compressive stress is exerted along the gate length direction and the tensile stress is exerted along the gate width direction.

With these arrangements, although the on-current of CMOSFET can be improved, the exposure process is additionally used. From this reason, some restrictions of the layout may occur. For example, If the arrangements of the above-described embodiments are applied to a static (S) RAM, the area of SRAM is broadened in some cases. The characteristics of an input/output circuit are required to have the same performance as that of the already existing devices.

FIG. 13 is a schematic plan view showing the structure of a semiconductor integrated circuit device. The semiconductor integrated circuit device has in its chip 11 a logical circuit 41, an SRAM circuit 42 and an input/output (I/O circuit) 43. The stress film structure of the above-described embodiments is applied only to the logical circuit 41 and is not applied to the input/output circuit 43 and SRAM circuit 42.

The present invention has been described in connection with the preferred embodiments. The invention is not limited only to the above embodiments. For example, although the silicon nitride film is used as the stress film, the invention is not limited thereto, but any dielectric film capable of exerting a stress can be used. Well-known various structures may be adopted to the structure of CMOSFET. It will be apparent to those skilled in the art that other various modifications, improvements, combinations, and the like can be made.

I claim:

1. a semiconductor device comprising:
   a semiconductor substrate having a p-channel type transistor region;
   an element isolation region formed in a surface portion of said semiconductor substrate, said element isolation region defining a p-channel type active region in said p-channel type transistor region;
   a p-channel type gate electrode structure formed above said semiconductor substrate, traversing said p-channel type active region and defining a p-channel region under said p-channel type gate electrode structure;

a compressive stress film selectively formed above said p-channel type active region and covering said p-channel type gate electrode structure; and a stress released region selectively formed above said element isolation region in said p-channel type transistor region, said stress released region releasing stress in said compressive stress film, wherein said stress released region is made of an ion implanted region, wherein said ion implanted region is a region where electrically inert impurity ions are implanted, wherein said compressive stress film above said p-channel type active region exerts a compressive stress on said p-channel region along a gate length direction, and said compressive stress film and said stress released region exert a tensile stress on said p-channel region along a gate width direction.

2. The semiconductor device according to claim 1, wherein said compressive stress film is a silicon nitride film.

3. The semiconductor device according to claim 1, wherein:

said semiconductor substrate has also an n-channel type transistor region;

said element isolation region defines an n-channel active region in said n-channel type transistor region; and the semiconductor device further comprises:

an n-channel type gate electrode structure formed above said semiconductor substrate, traversing said n-channel type active region and defining an n-channel region under said n-channel type gate electrode structure; and an insulating film formed above said n-channel type transistor region and covering said n-channel type gate electrode structure.

4. The semiconductor device according to claim 3, wherein said insulating film is a film having the tensile stress and exerts the tensile stress on said n-channel region along the gate length direction.

5. The semiconductor device according to claim 4, wherein said insulating film is a silicon nitride film.

6. The semiconductor device according to claim 3, wherein said insulating film is a same film as said compressive stress film and stress is released from a whole portion of said insulating film.

7. The semiconductor device according to claim 1, wherein said semiconductor substrate is a silicon substrate having a (001) plane and the gate length direction is along <110> direction.

* * * * *